United States Patent
Chen et al.

(10) Patent No.: US 10,721,835 B2
(45) Date of Patent: Jul. 21, 2020

(54) INFORMATION HANDLING SYSTEM WITH AN ADJUSTABLE GUIDE FOR PERIPHERAL CARDS

(71) Applicant: DELL PRODUCTS, LP, Round Rock, TX (US)

(72) Inventors: Yu-LIn Chen, Taipei (TW); Chun-Cheng Lin, Taipei (TW); Kuang-Jye Tuan, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/714,709

(22) Filed: Sep. 25, 2017

(65) Prior Publication Data

US 2019/0098789 A1    Mar. 28, 2019

(51) Int. Cl.
*H05K 7/14* (2006.01)
(52) U.S. Cl.
CPC ......... *H05K 7/1489* (2013.01); *H05K 7/1487* (2013.01)
(58) Field of Classification Search
CPC .................................................. H05K 7/1489
USPC ............................................................ 361/724
See application file for complete search history.

(56) References Cited

U.S. PATENT DOCUMENTS

| | | | |
|---|---|---|---|
| 6,272,010 B1 | 8/2001 | Schmitt | |
| 6,282,099 B1 * | 8/2001 | Wilson | G06F 1/184 361/727 |
| 6,522,553 B2 | 2/2003 | Hardin et al. | |
| 7,108,530 B2 * | 9/2006 | Kimura | G06K 7/0013 361/755 |
| 8,098,497 B2 * | 1/2012 | Chiang | H05K 7/142 361/736 |
| 8,320,118 B2 * | 11/2012 | Chuang | G11B 33/124 211/26 |
| 8,406,003 B2 * | 3/2013 | Zhang | G06F 1/187 361/679.39 |
| 8,649,182 B2 * | 2/2014 | Ko | G06F 1/1633 361/755 |
| 9,281,015 B1 * | 3/2016 | Wu | G11B 33/124 |
| 9,652,001 B2 * | 5/2017 | Wang | G11B 33/027 |

* cited by examiner

*Primary Examiner* — Rockshana D Chowdhury
(74) *Attorney, Agent, or Firm* — Larson Newman, LLP

(57) ABSTRACT

An information handling system includes a bracket in physical contact with a server compute module. The bracket includes an adjustable guide that can rotate between a first position and a second position within the bracket. The adjustable guide is in the first position in response to a first peripheral card being inserted within the bracket, and is in the second position in response to a second peripheral card being inserted within the bracket.

20 Claims, 5 Drawing Sheets

INFORMATION HANDLING SYSTEM WITH AN ADJUSTABLE GUIDE FOR PERIPHERAL CARDS

FIELD OF THE DISCLOSURE

The present disclosure generally relates to information handling systems, and more particularly relates to an information handling system with an adjustable guide for peripheral cards.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a server compute module, and a bracket. The bracket may be in physical contact with the server compute module. The bracket includes an adjustable guide. The adjustable guide may rotate between a first position and a second position within the bracket. The adjustable guide may be in the first position in response to a first peripheral card being inserted within the bracket, and may be in the second position in response to a second peripheral card being inserted within the bracket.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
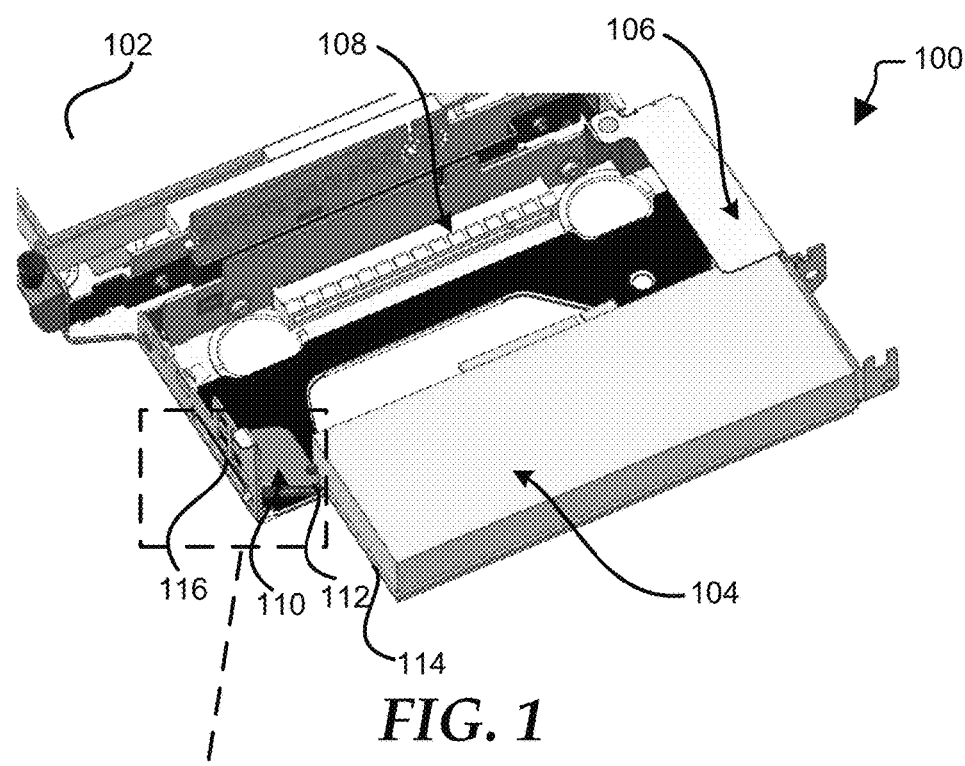
FIG. 1 is a perspective view of an information handling system including an embodiment of a peripheral card guide according to at least one embodiment of the disclosure.

FIG. 1 shows a portion of an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The information handling system 100 includes a server compute module 102, a peripheral card 104, a bracket 106, a peripheral slot 108, and an adjustable guide 110. In an embodiment, the bracket 106 can be securely mounted to the server compute module 102, and the peripheral slot 108 can provide electrical communication between the peripheral card 104 and the server compute module 102 after the peripheral card 104 is plugged into the peripheral slot 108. In an embodiment, the peripheral card 104 can be a peripheral component interconnect express card. In an embodiment, the bracket 106 and adjustable guide 110 can accommodate different size peripheral cards, such as the peripheral card 104 in FIG. 1 and peripheral card 404 in FIG. 4. The operation of the adjustable guide 110 will be described with respect to FIGS. 1-4.

Figure 2:
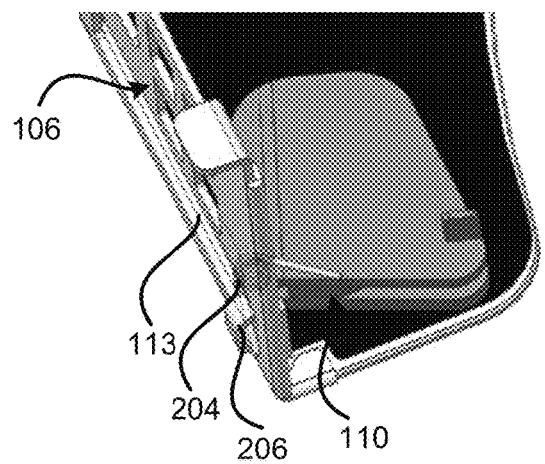
FIG. 2 is a perspective view of an embodiment of an adjustable bracket in a first position within the peripheral card guide according to at least one embodiment of the present disclosure.
Figure 3:
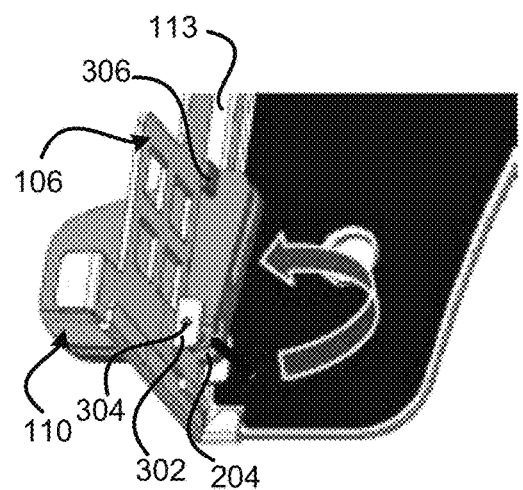
FIG. 3 is a perspective view showing the adjustable bracket in a second position within the peripheral card guide according to at least one embodiment of the disclosure.

Referring now to FIG. 1, bracket 106 includes a bottom, a back wall, and two side walls. The bracket 106 can be mounted to the server compute module 102 along the back wall of the bracket 106. The adjustable guide 110 can be mounted on one of the side walls and can be held in place via a mount 302 and pin 304 as shown in FIG. 3. The adjustable guide 110 can include a spring 204 partially incorporated within the adjustable guide 110 as shown in FIG. 2. In an embodiment, the spring 204 can be held in physical contact with the side wall of the bracket 106 via a leg of the spring 204 being inserted with a holder 206 of the side wall as shown in FIG. 2. In an embodiment, the spring 204 can apply a force to the adjustable guide 110 to place the adjustable guide 110 in a first position with respect to the side wall of the bracket 106 as shown in FIG. 2.

While the adjustable guide 110 is in the first position, a distance from an edge of the adjustable guide 110 to the opposite side wall of the bracket 106 can be substantially equal to a length of the peripheral card 104. In an embodiment, the peripheral card 104 can be a short, or non-standard, peripheral card, such that the length of the peripheral card 104 is less than a standard length peripheral card. In an embodiment, the adjustable guide 110 can include a channel 112 that can interface with a bottom 114 of the peripheral card 104. Thus, as the peripheral card 104 is inserted into the bracket 106, bottom 114 of the peripheral card 104 can fit within the channel 112 to guide the peripheral card 104 within the bracket 106. Additionally, as the peripheral card 104 is inserted into the bracket 106, the peripheral card 104 can fit in between the adjustable guide 110 and the opposing side wall of the bracket 106 while the adjustable guide 110 is in the first position as shown in FIG. 1.

Referring now to FIG. 3, when a force is applied to the adjustable guide 110 that is greater than the force of the spring 204, the adjustable guide 110 can rotate around the pin 304, and extend through a hole 113 within the side wall of the bracket 106. In an embodiment, the force can be applied to the adjustable guide by a peripheral card, such as peripheral card 404 of FIG. 4, that is longer than a space from an edge of the adjustable guide 110 to the opposite side wall of the bracket 106 while the adjustable guide 110 is in the first position. In an embodiment, the peripheral card 404 can be a standard half length peripheral card. The force applied by the peripheral card, such as peripheral card 404 of FIG. 4, can cause the adjustable guide 110 to rotate around the pin 304 until a tab 306 of the adjustable guide 110 is placed in physical contact with the side wall of the bracket 106. In an embodiment, when the tab 306 is in physical contact with the side wall, the adjustable guide 110 can be in a second position with respect to the side wall. In an embodiment, the tab 306 can be located on the adjustable guide 110 in a location that leaves a particular amount of the adjustable guide 110 still extending into the space within the bracket 106. In an embodiment, the particular amount of the adjustable guide 110 that is still within the bracket 106 can provide a second specific distance between the edge of the adjustable guide 110 and the opposing wall of the bracket 106.

Figure 4:
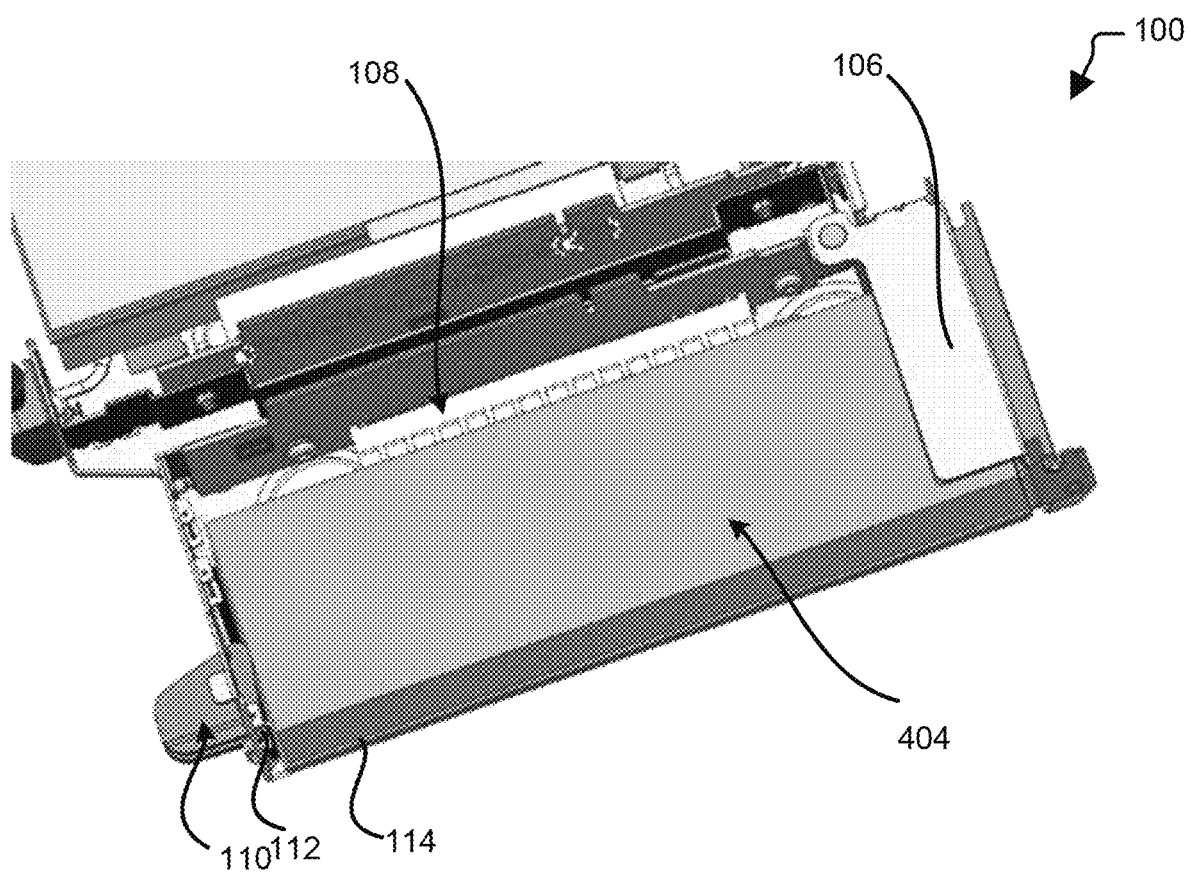
FIG. 4 is a perspective view showing the information handling system including the embodiment of the peripheral card guide according to at least one embodiment of the present disclosure.

The second specific distance can be substantially equal to the length of the peripheral card 404, such that the peripheral card 404 can fit in between the adjustable guide 110 and the opposing side wall of the bracket 106 while the adjustable guide 110 is in the second position as shown in FIG. 4. While the peripheral card 404 is being inserted within the bracket 106, a bottom 414 of the peripheral card 404 can be placed within the channel 112 of the adjustable guide 110 to position the peripheral card within the bracket 106 so that the peripheral card 404 can properly align with the peripheral slot 108. Thus, the adjustable guide 110 can rotate between a first position and a second position to enable both peripheral card 104 and peripheral card 404 to be inserted within the bracket 106, and can provide proper alignment of the peripheral cards 104 and 404 with the peripheral slot 108 via the channel 112.

Figure 5:
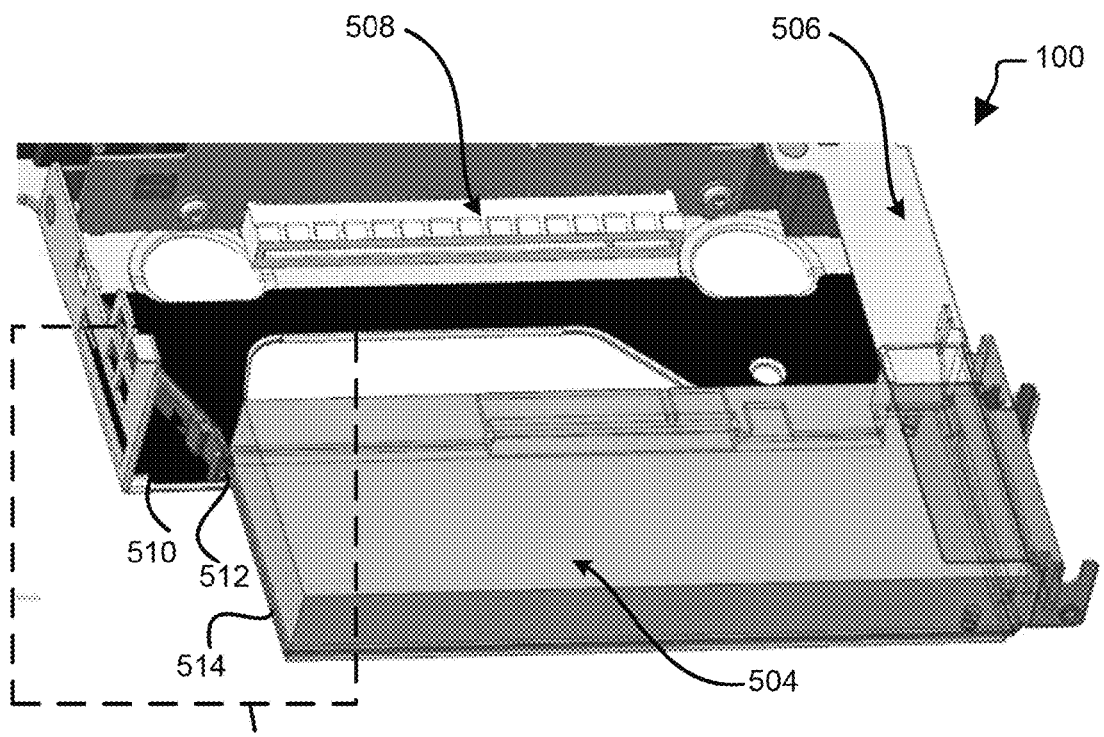
FIG. 5 is a perspective view of the information handling system including another embodiment of the peripheral card guide according to at least one embodiment of the present disclosure.

FIG. 5 shows an information handling system 500 including an embodiment of a peripheral card guide 510 according to at least one embodiment of the present disclosure. The information handling system 500 includes a peripheral card 504, a bracket 506, a peripheral slot 508, and the adjustable guide 510. In an embodiment, the bracket 506 can be securely mounted to a server compute module, such as the server compute module 102 of FIG. 1, and the peripheral slot 508 can provide electrical communication between the peripheral card 504 and the server compute module after the peripheral card 504 is plugged into the peripheral slot 508. In an embodiment, the peripheral card 504 can be substantially similar to peripheral card 104 of FIG. 1, the bracket 506 can be substantially similar to bracket 106 of FIG. 1, and the peripheral slot 508 can be substantially similar to peripheral slot 108 of FIG. 1. In an embodiment, the peripheral card 504 can be a peripheral component interconnect express card. In an embodiment, the bracket 506 and adjustable guide 510 can accommodate different size peripheral cards, such as the peripheral card 504 in FIG. 5 and peripheral card 1004 in FIG. 10. The operation of the adjustable guide 510 will be described with respect to FIGS. 5-10.

Referring now to FIG. 5, bracket 506 includes a bottom, a back wall, and two side walls. The bracket 506 can be mounted to a server compute module, such as the server compute module 102 of FIG. 1, along the back wall of the bracket 506. The adjustable guide 510 can be mounted on one of the side walls and can be held in place via a mount 902 and pin 904 as shown in FIG. 9. The adjustable guide 510 can include a spring 906 located in between the adjustable guide 510 and the side wall of the bracket 506, as shown in FIG. 9. In an embodiment, the spring 906 can apply a force to the adjustable guide 510 to place the adjustable guide 510 in a first position with respect to the side wall of the bracket 506 as shown in FIGS. 5-9.

Figure 6:
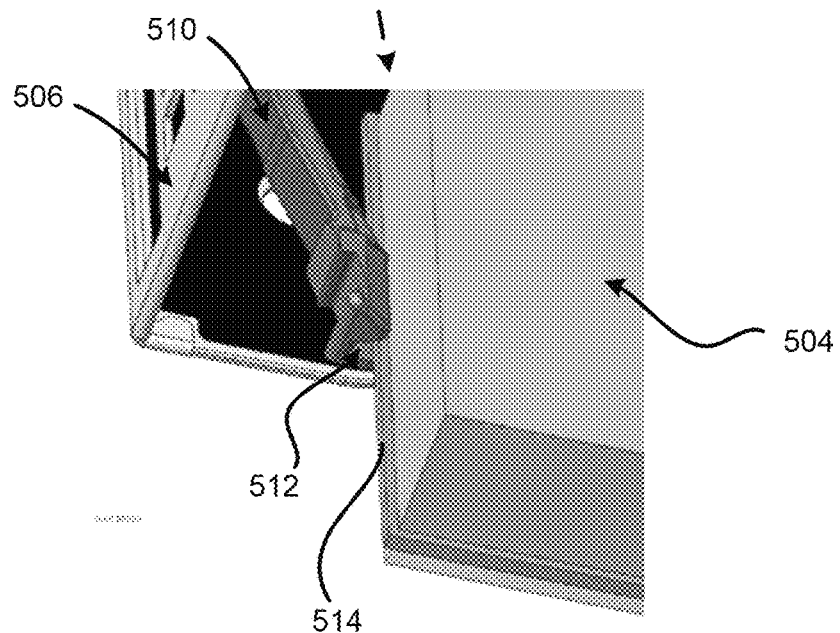
FIG. 6 is a perspective view of showing an enlarged view of a portion of the other embodiment of the peripheral card guide according to an embodiment of the present disclosure.

While the adjustable guide 510 is in the first position, a distance from an edge of the adjustable guide 510 to the opposite side wall of the bracket 506 can be substantially equal to a length of the peripheral card 504. In an embodiment, the peripheral card 504 can be a short, or non-standard, peripheral card, such that the length of the peripheral card 504 is less than a standard length peripheral card. In an embodiment, the adjustable guide 510 can include a channel 512 that can interface with a bottom 514 of the peripheral card 504 as shown in FIG. 6.

Figure 7:
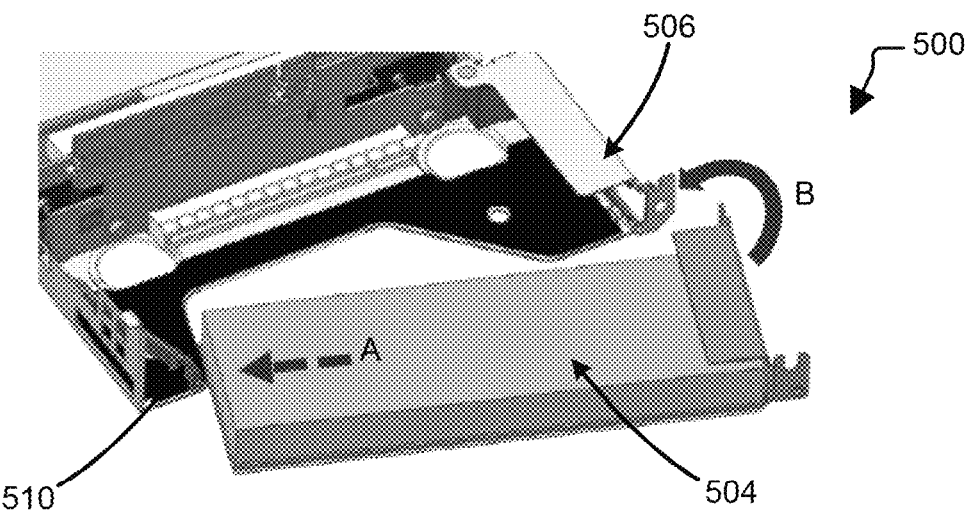
FIG. 7 is a perspective view of the information handling system including a peripheral card in a first position within the other embodiment of the peripheral card guide according to at least one embodiment of the present disclosure.

The insertion of the peripheral card 504 will be described with respect to FIGS. 7-9. FIG. 7 shows how the peripheral card 504 may be moved in the direction of arrow A until coming in physical contact with the adjustable guide 510. At this point in the insertion, the bottom 514 of the peripheral card 504 is inserted within the channel 512 of the adjustable guide 510. The peripheral card 504 can then be rotated, as shown by arrow B, until an edge of the peripheral card 504 is aligned with a side wall of the bracket 506 that is opposite of the adjustable guide 510. While the peripheral card 504 is being inserted within the bracket 506, the bottom 514 of the peripheral card 504 can be placed within the channel 512 of the adjustable guide 510 to position the peripheral card 504 within the bracket 506 so that the peripheral card 504 can properly align with the peripheral slot 508.

Figure 8:
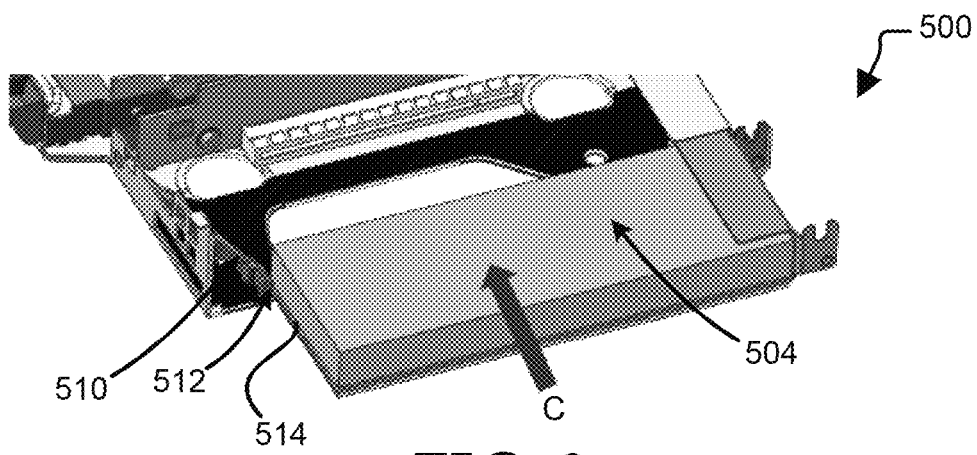
FIG. 8 is a perspective view of the information handling system including the peripheral card in a second position within the other embodiment of the peripheral card guide according to an embodiment of the present disclosure.
Figure 9:
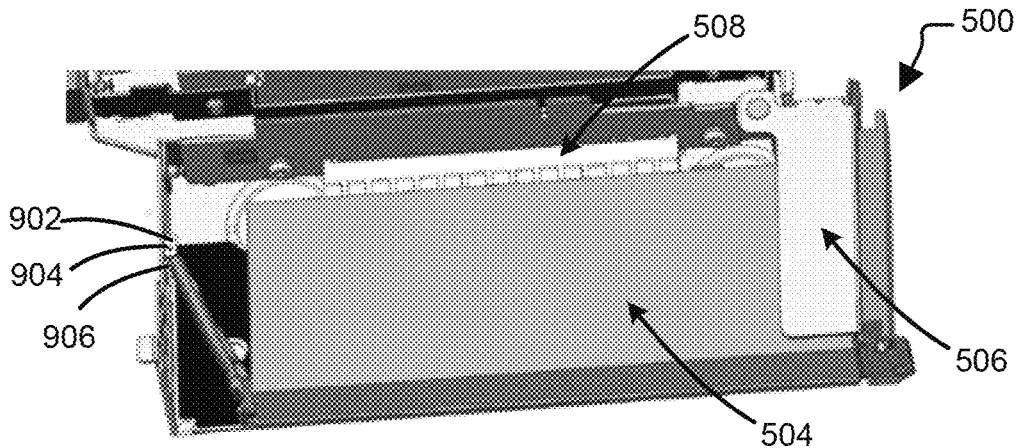
FIG. 9 is a perspective view of the information handling system including the peripheral card in a third position within the other embodiment of the peripheral card guide according to at least one embodiment of the present disclosure.

FIG. 8 shows how the peripheral card 504 may be inserted into the bracket 506, in the direction of arrow C, while the bottom 514 of the peripheral card 504 slides within the channel 512 to guide the peripheral card 504 within the bracket 506. Additionally, as the peripheral card 504 is inserted into the bracket 506, the peripheral card 504 can fit in between the adjustable guide 510 and the opposing side wall of the bracket 510 while the adjustable guide 510 is in the first position as shown in FIG. 8. FIG. 9 shows how the peripheral card 504 may be inserted within the bracket 506 connecting with the peripheral slot 508.

Figure 10:
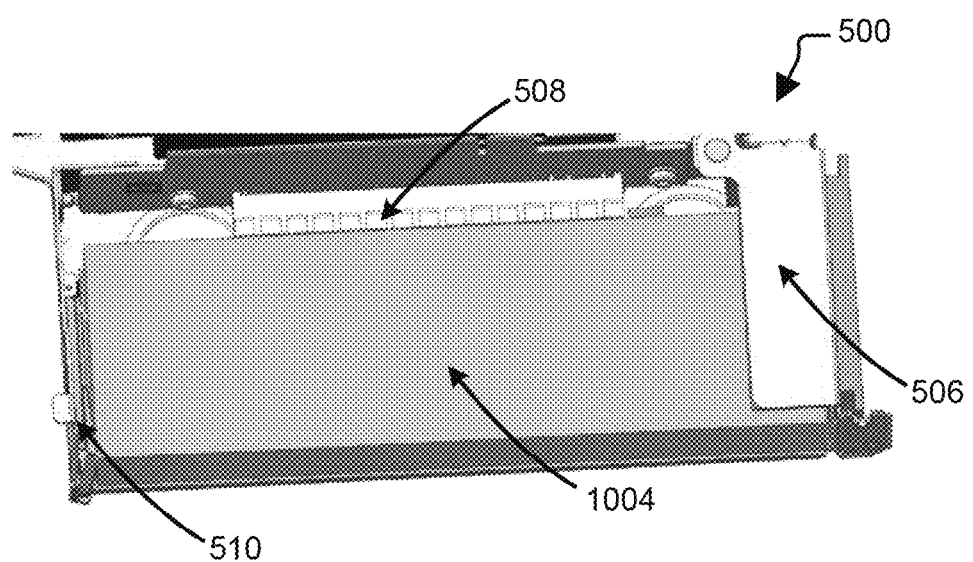
FIG. 10 is a perspective view of the information handling system including another peripheral card in the third position within the other embodiment of the peripheral card guide according to an embodiment of the present disclosure.

However, if a peripheral device 1004 is to be inserted within the bracket 506, a force can be applied to the adjustable guide 510, in the direction of arrow A of FIG. 7, that is greater than the force of the spring 906. In this situation, the adjustable guide 510 can rotate around the pin 904 until the entire length of the adjustable guide 510 is in physical contact with the side wall of the bracket 506 as shown in FIG. 10. In an embodiment, the peripheral card 1004 can be longer than a space from an edge of the adjustable guide 510 to the opposite side wall of the bracket 506 while the adjustable guide 510 is in the first position. In an embodiment, the peripheral card 1004 can be a standard half length peripheral card. In an embodiment, when the entire length of the adjustable guide 510 is in physical contact with the side wall of the bracket 506, the adjustable guide 510 can be in a second position with respect to the side wall of the bracket 506. In an embodiment, the width of the adjustable guide 510 leaves a particular amount of the adjustable guide 510 still extending into the space within the bracket 506. In an embodiment, the particular amount of the adjustable guide 510 that is still within the bracket 506 can provide a second specific distance between the edge of the adjustable guide 510 and the opposing wall of the bracket 506.

The second specific distance can be substantially equal to the length of the peripheral card 1004, such that the peripheral card 1004 can fit in between the adjustable guide 510 and the opposing side wall of the bracket 506 while the adjustable guide 510 is in the second position as shown in FIG. 10. Thus, the adjustable guide 510 can rotate between a first position and a second position to enable both peripheral card 504 and peripheral card 1004 to be inserted within the bracket 506, and can provide proper alignment of the peripheral cards 504 and 1004 with the peripheral slot 508 via the channel 512.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A bracket to receive a peripheral card of an information handling system, the bracket comprising:
  an adjustable guide rotatable between a first position and a second position within the bracket, the adjustable guide including a channel disposed in the first position in response to a first peripheral card being inserted within the bracket, and disposed in the second position in response to a second peripheral card being inserted within the bracket, wherein the adjustable guide extends through a hole within a first side wall of the bracket and the adjustable guide channel engages a bottom of the second peripheral card when the adjustable guide is rotated from the first position to the second position, and wherein a length of a longest side of the adjustable guide is shorter than a length of a longest side of the first peripheral card or the second peripheral card.

2. The bracket of claim 1, further comprising:
  a mount in physical contact with the first side wall of the bracket; and
  a pin inserted within the mount and the adjustable guide to secure the adjustable guide to the first side wall.

3. The bracket of claim 1, further comprising:
  a spring to exert a first force on the adjustable guide to place the adjustable guide in the first position.

4. The bracket of claim 3, wherein the adjustable guide rotates from the first position to the second position in response to a second force being exerted on the adjustable guide, wherein the second force is greater than the first force of the spring.

5. The bracket of claim 1, wherein the channel aligns the second peripheral card when the adjustable guide is rotated from the first position to the second position.

6. The bracket of claim 1, the adjustable guide comprising:
a tab to be placed in physical contact with the first side wall of the bracket in response to the adjustable guide being located in the second position.

7. The bracket of claim 1, the adjustable guide extends through the first side wall when the adjustable guide is in the second position.

8. The bracket of claim 1, an entire length of the adjustable guide is in physical contact with the first side wall when the adjustable guide is in the second position.

9. The bracket of claim 1, wherein a distance between the adjustable guide and a second side wall of the bracket is less when the adjustable guide is in the first position as compared to when the adjustable guide is in the second position.

10. An information handling system comprising:
a server compute module; and
a bracket in physical contact with the server compute module, the bracket including:
an adjustable guide rotatable between a first position and a second position within the bracket, the adjustable guide including a channel and disposed in the first position in response to a first peripheral card being inserted within the bracket, and disposed in the second position in response to a second peripheral card being inserted within the bracket, wherein the adjustable guide extends through a hole within a first side wall of the bracket and the channel continuously engages a bottom of the second peripheral card when the adjustable guide is rotated from the first position to the second position, and wherein a length of a longest side of the adjustable guide is shorter than a length of a longest side of the first peripheral card or the second peripheral card.

11. The information handling system of claim 10, the bracket further comprising:
a mount in physical contact with the first side wall of the bracket; and
a pin inserted within the mount and the adjustable guide to secure the adjustable guide to the first side wall.

12. The information handling system of claim 10, the bracket further comprising:
a spring to exert a first force on the adjustable guide to place the adjustable guide in the first position.

13. The information handling system of claim 12, wherein the adjustable guide rotates from the first position to the second position in response to a second force being exerted on the adjustable guide, wherein the second force is greater than the first force of the spring.

14. The information handling system of claim 10, wherein the channel aligns the second peripheral card via the bottom being placed within the channel.

15. The information handling system of claim 10, the adjustable guide comprising:
a tab to be placed in physical contact with the first side wall of the bracket in response to the adjustable guide being located in the second position.

16. The information handling system of claim 10, the adjustable guide extends through the first side wall when the adjustable guide is in the second position.

17. The information handling system of claim 10, an entire length of the adjustable guide is in physical contact with the first side wall when the adjustable guide is in the second position.

18. The information handling system of claim 10, wherein a distance between the adjustable guide and a second side wall of the bracket is less when the adjustable guide is in the first position as compared to when the adjustable guide is in the second position.

19. An information handling system comprising:
a server compute module; and
a bracket in physical contact with the server compute module, the bracket to receive a peripheral card, the bracket including:
an adjustable guide rotatable between a first position and a second position within the bracket, the adjustable guide including a channel and disposed in the first position in response to a first peripheral card being inserted within the bracket, and disposed in the second position in response to a second peripheral card being inserted within the bracket, wherein the adjustable guide extends through a hole within a first side wall of the bracket and the channel continuously engages a bottom of the second peripheral card when the adjustable guide is rotated from the first position to the second position, and wherein a length of a longest side of the adjustable guide is shorter than a length of a longest side of the first peripheral card or the second peripheral card;
a mount in physical contact with the first side wall of the bracket;
a pin inserted within the mount and the adjustable guide to secure the adjustable guide to the first side wall; and
a spring to bias the adjustable guide toward the first position.

20. The information handling system of claim 19, where the adjustable guide channel receives a bottom of the second peripheral card and the channel aligns the second peripheral card via the bottom being placed within the channel.

* * * * *